(12) United States Patent
Xu

(10) Patent No.: US 10,754,584 B2
(45) Date of Patent: Aug. 25, 2020

(54) DATA PROCESSING METHOD AND SYSTEM FOR 2R1W MEMORY

(71) Applicant: CENTEC NETWORKS (SU ZHOU) CO., LTD., Jiangsu (CN)

(72) Inventor: Jun Xu, Jiangsu (CN)

(73) Assignee: CENTEC NETWORKS (SU ZHOU) CO., LTD., Suzhou, Jiangsu (CN)

(*) Notice: Subject to any disclaimer, the term of this patent is extended or adjusted under 35 U.S.C. 154(b) by 41 days.

(21) Appl. No.: 16/319,297

(22) PCT Filed: Feb. 15, 2017

(86) PCT No.: PCT/CN2017/073646
§ 371 (c)(1),
(2) Date: Jan. 18, 2019

(87) PCT Pub. No.: WO2018/018876
PCT Pub. Date: Feb. 1, 2018

(65) Prior Publication Data
US 2019/0278520 A1  Sep. 12, 2019

(30) Foreign Application Priority Data
Jul. 28, 2016 (CN) .......................... 2016 1 0606967

(51) Int. Cl.
*G11C 8/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC .... G06F 3/0659; G06F 3/0604; G06F 3/0673; G06F 12/06; G11C 11/419; H03K 19/21
(Continued)

(56) References Cited

U.S. PATENT DOCUMENTS 6,578,097 B1  6/2003 Lin et al.
6,640,300 B1  10/2003 Raza
(Continued)

FOREIGN PATENT DOCUMENTS

CN   101566941 A   10/2009
CN   102436420 A   5/2012
(Continued)

OTHER PUBLICATIONS

International Search Report for PCT/CN2017/073646 dated May 22, 2017 and its English translation provided by WIPO.
(Continued)

*Primary Examiner* — Harry W Byrne
(74) *Attorney, Agent, or Firm* — Ladas & Parry, LLP

(57) ABSTRACT

The present invention provides a data processing method and system for a 2R1W memory. The data processing method comprises: selecting 2n+1 SRAM2P memories with the same depth and width in accordance with a depth and a width of the 2R1W memory to construct a hardware architecture of the 2R1W memory, one of the plurality of SRAM2P memories being an auxiliary memory, and the rest of the SRAM2P memories being main memories; and when the data are written in and/or read from the 2R1W memory, associating data in the main memories and data in the auxiliary memory in accordance with a current pointer address of the data and performing an XOR operation on the associated data to complete data writing and reading. Only extra ½n of the memory area is required to construct the 2R1W memory based on a conventional SRAM unit.

16 Claims, 5 Drawing Sheets

(51) Int. Cl.
*G11C 11/419* (2006.01)
*G06F 12/06* (2006.01)
*H03K 19/21* (2006.01)

(52) U.S. Cl.
CPC .......... *G06F 12/06* (2013.01); *G11C 11/419* (2013.01); *H03K 19/21* (2013.01)

(58) Field of Classification Search
USPC ........ 365/46, 100, 148, 163, 158, 171, 173, 365/185.13, 185.23, 185.25, 210.01, 365/210.13, 230.03
See application file for complete search history.

(56) References Cited

U.S. PATENT DOCUMENTS

| | | | | |
|---|---|---|---|---|
| 2003/0039165 A1* | 2/2003 | Shau | ............... | G11C 7/06 365/230.03 |
| 2003/0039166 A1* | 2/2003 | Shau | ............... | G11C 7/02 365/230.03 |
| 2003/0202405 A1* | 10/2003 | Shau | ............... | G11C 7/06 365/200 |
| 2005/0169090 A1* | 8/2005 | Shau | ............... | G11C 7/06 365/230.03 |
| 2007/0274303 A1 | 11/2007 | Cui et al. | | |
| 2010/0329068 A1* | 12/2010 | Sasaki | ............... | G11C 8/08 365/230.06 |
| 2011/0145777 A1* | 6/2011 | Iyer | ............... | G06F 3/0629 716/132 |
| 2011/0302376 A1* | 12/2011 | Zhou | ............... | G11C 8/16 711/149 |
| 2011/0310691 A1* | 12/2011 | Zhou | ............... | G11C 8/16 365/230.03 |
| 2012/0102298 A1 | 4/2012 | Sengupta et al. | | |
| 2014/0177324 A1* | 6/2014 | Liu | ............... | G11C 8/16 365/154 |
| 2014/0321471 A1 | 10/2014 | Lau et al. | | |
| 2015/0212945 A1* | 7/2015 | Jain | ............... | G06F 12/0864 711/128 |

FOREIGN PATENT DOCUMENTS

| | | |
|---|---|---|
| CN | 102436427 A | 5/2012 |
| CN | 103309626 A | 9/2013 |
| CN | 103345448 A | 10/2013 |
| CN | 104484129 A | 4/2015 |
| CN | 104520817 A | 4/2015 |
| CN | 106250321 A | 12/2016 |

OTHER PUBLICATIONS

Written Opinion of the International Search Authority PCT/CN2017/073646 dated May 22, 2017 and its English translation provided by Google Translate.
First Review Notice for CN 106250321 A, Patent No. 201610606967.3. Published Aug. 31, 2018.

* cited by examiner

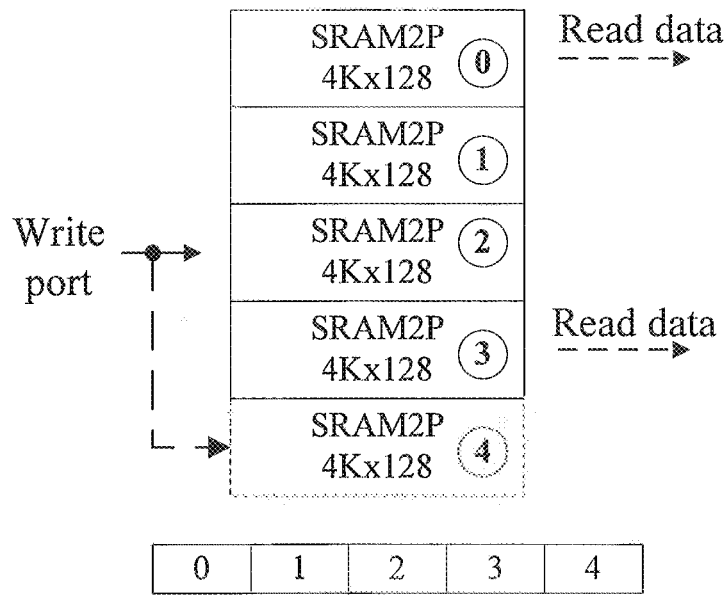

FIG. 7a

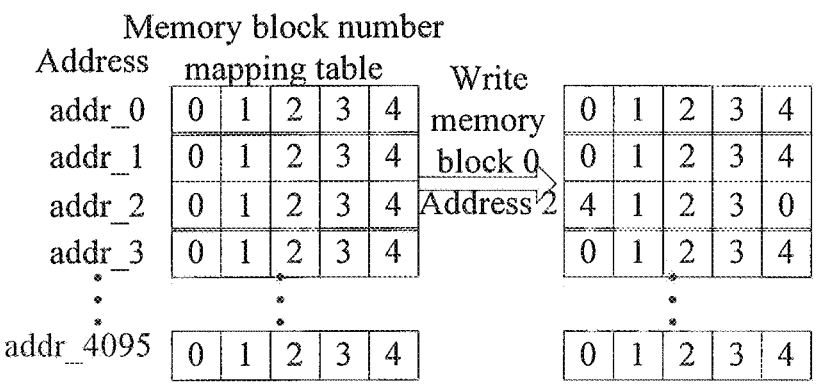

FIG. 7b selecting 2n+1 SRAM2P memories with the same depth and width in accordance with a depth and a width of a 2R1W memory to construct a hardware architecture of the 2R1W memory when data are written in and/or read from the 2R1W memory, associating data in the main memories and data in the auxiliary memory in accordance with a current pointer address of the data and performing an XOR operation on the associated data to complete data writing and reading

FIG. 8

DATA PROCESSING METHOD AND SYSTEM FOR 2R1W MEMORY

CROSS-REFERENCE TO RELATED APPLICATIONS

The present application is the U.S. National Phase of PCT/CN2017/073646 filed on Feb. 15, 2017, which claims priority to Chinese Patent Application No. 201610606967.3 filed on Jul. 28, 2018, the disclosures of which are hereby incorporated by reference.

The present application claims the priority of Chinese Patent Application No. 201610606967.3, filed to the State Intellectual Property Office on Jul. 28, 2016, and entitled "Data Processing Method and System for 2R1W Memory", the content of which is incorporated herein by reference in its entirety.

TECHNICAL FIELD

The present invention relates to the technical field of network communication and in particular to a data processing method and system for a 2R1W memory.

BACKGROUND

When an Ethernet switch chip is designed, it is usually necessary to use a large-capacity multi-port memory, such as a 2-read and 1-write (supporting 2 read ports and 1 write port simultaneously) memory, a 1-read and 2-write memory, a 2-read and 2-write memory or a memory with more ports.

Usually, a supplier generally provides only one read or write memory, one 1-read and 1-write memory, and two read or write memories. Thus, a designer can only construct a multi-port memory based on the basic memory units described above.

As shown in FIG. 1, which is a structural schematic view of a digital circuit of a typical 6T SRAM, it can be known that the 6T SRAM consists of six MOS transistors.

With reference to FIG. 2, for convenience of description, FIG. 1 is simplified in the way that the four MOS transistors in the middle are simplified into two inverters that are connected back to back. A true value of a memory unit is stored on the left side, a Inverted value of the memory unit is stored on the right side, the MOS transistor on the left is connected with a bit line X and the MOS transistor on the right is connected with a bit line Y.

In a data reading process, the bit line X and the bit line Y are charged to certain voltage values in advance. Then, a certain voltage is applied to a word line. The two MOS transistors on the left and the right are conducted. The MOS transistor on the left outputs the stored true value, e.g., "0", onto the bit line X. The MOS transistor on the right outputs the stored inverted value, e.g., "1", onto the bit line Y. The bit line X and the bit line Y outputs the true value "0" of the memory unit through a connected differential sense amplifier at last.

In a data writing process, for example, a datum "1" is written in the memory unit. The bit line X inputs "1", and the bit line Y inputs "0" to form complementary input. Then, the word line is opened. The two MOS transistors on the left and the right are conducted. In this way, the true value is forcibly modified into "1" and the negated value is forcibly modified into "0". It can thus be known that reading and writing of the 6T SRAM cannot be performed simultaneously. Correspondingly, the supplier can provide a dual-port SRAM memory.

With reference to FIG. 3, which is a structural schematic view of a digital circuit of a dual-port SRAM memory, two MOS transistors are added on the basis of the forgoing 6T SRAM. Not only that, to prevent the true value of the SRAM memory from flipping during data reading, four MOS transistors in the middle are larger than the four corresponding MOS transistors of the 6T SRAM. As shown by data provided by a certain manufacturer under 14 nm, the 6T SRAM is 0.064 square microns while an 8T SRAM is 0.201 square microns which is 3.14 times of the former.

With reference to FIG. 4, to prevent the SRAM memory which has both reading and writing functions from an excessive area and to increase the memory density of the memory, usage of the 8T SRAM is avoided as much as possible. Thus, the above problem is avoided through line changes on the basis of the 6T SRAM. Correspondingly, on the basis of the 6T SRAM, one word line is segmented into a left one and a right one, such that two read ports can be made for simultaneous operation or one write port is made. In this way, data read from the left MOS transistor and data read from the right MOS transistor can be performed simultaneously. It should be noted that the data read from the right MOS transistor need to be inverted for use. Meanwhile, for not affecting the data reading speed, a sense amplifier for reading needs to be a pseudo-differential amplifier. Thus, the 6T SRAM keeps its area unchanged. The only cost is to double the word line so as to keep the overall memory density basically unchanged.

Therefore, on the basis that the port type of the SRAM is 1-read or 1-write, 2-read or 2-write, and 1-write or 2-read, the number of ports of the SRAM is increased by customized design, for example, a method for modifying the memory unit, and algorithm design.

As shown in FIG. 5, which is a schematic view of a read-and-write operation procedure of a 2R1W formed by customized design of another embodiment in the prior art, the ports of the SRAM can be increased through the customized design. In an example of FIG. 4, one word line is segmented into two word lines, and the number of read ports is increased to two. In the prior art, a time-sharing operation technology, namely, performing a read operation on a rising edge of a clock and a write operation on a falling edge of the block, can be adopted to expand a basic 1-read or 1-write SRAM into a 1-read and 1-write SRAM. That is, 1-read operation and 1-write operation can be performed simultaneously with the memory density basically unchanged.

The period of the customized design is generally long, as spice simulation is required, and a memory compiler is also needed to generate the SRAM of different sizes and types. For suppliers, it usually takes six to nine months to provide a new type of SRAM, and such a customized design is strongly related to the specific process (such as 14 nm and 28 nm of GlobalFoundries or 28 nm and 16 nm of TSMC). Once the process changes, the customized-designed SRAM library needs to be redesigned.

As shown in FIG. 6, which is a schematic view of a read-and-write operation procedure of a 2R1W memory formed by an algorithm design in an embodiment of the prior art, the algorithm design is to realize the 2R1W memory through an algorithm on the basis of an existing SRAM type provided by the suppliers and has the greatest advantages of avoiding customized design and saving time. Meanwhile, it has nothing to do with a technology library, and can be easily transplanted between different technology libraries.

In this embodiment, taking constructing of a 2R1W SRAM based on an SRAM2P as an example, the SRAM2P is an SRAM which can support 1 read and 1 read/write. That is, two read operations, or one read and one write operation, can be simultaneously performed on the SRAM2P.

In this embodiment, the 2R1W SRAM is built based on SRAM2P by replicating one SRAM. In this example, SRAM2p_1 on the right is a copy of SRAM2P_0 on the left. During specific operations, the two SRAM2Ps serve as a 1-read and 1-write memory. During data writing, data are written in the left and right SRAM2Ps. During data reading, data A are regularly read from SRAM2P_0, and data B are regularly read from SRAM2P_1, such that one write operation and two read operations can be made concurrently.

In the process of this algorithm design, there needs an additional copy of the SRAM2P memory and area doubling of the memory, which results in large overhead.

As shown in FIGS. 7a and 7b, which are schematic views of read-and-write operation procedures of 2R1W memories formed by an algorithm design in another embodiment of the prior art, in this embodiment, a logically entire block of 16384-depth SRAM is segmented into four blocks of 4096-depth SRAM2Ps with the numbers of 0, 1, 2 and 3. A 4096-depth SRAM with the number of 4 is added to solve a read-and-write conflict. For reading of the data A and B, the two read operations can be kept concurrent forever. When addresses of the two read operations are in different SRAM2Ps, since any one of the SRAM2Ps can be configured into a 1R1W type, no read-and-write conflict exists. When addresses of the two read operations are in the same SRAM2P, e.g., SRAM2P_0, since the same SRAM2P can only provide up to 2 ports for simultaneous operation, at this time, the ports are taken up by the two read operations. If exactly one write operation is to be written into SRAM2P_0, the data are written to the fourth SRAM2P_4 of the memory.

In this embodiment, there needs a memory block mapping table to record which memory block stores valid data. As shown in FIG. 7b, the memory block mapping table has the same depth as a memory block, namely 4096 depths. In each entry, the numbers from 0 to 4 of all memory blocks are sequentially stored after initialization. In the example of FIG. 7a, as SRAM2P_0 has a read-and-write conflict during data writing, data are actually written into SRAM2P_4. At this time, the read operation reads corresponding content in the memory mapping table. The original content is {0, 1, 2, 3, 4}, which becomes {4, 1, 2, 3, 0} after modification. The number of the first block and the number of the fourth block are exchanged, which represents that the data are actually written into SRAM2P_4. Meanwhile, SRAM2P_0 becomes a backup entry.

During data reading, it is necessary to firstly read a memory block number mapping table of the corresponding address, to check which memory block the valid data are stored in. For example, when data of the address of 5123 are to be read, content stored at the address 1027 (5123−4096=1027) of the memory block number mapping table is read first. Content at the address 1027 of a corresponding memory block is read in accordance with the number in the second line.

For the data writing operation, the memory block number mapping table needs to provide a 1-read and 1-write port. For the two data reading operations, the memory block number mapping table needs to provide two read ports. Thus, the memory block number mapping table needs to provide three read ports and 1 write port in total. These four access operations have to be performed simultaneously.

Therefore, in contrast with the first design, this algorithm design saves ¾ SRAM in size but needs an additional memory block number mapping table. Each time of read or write operation needs reading of the mapping table first, increasing access delay. Meanwhile, the memory block number mapping table needs four access ports, including three read ports and one write port, which cannot be satisfied until a special SRAM design is adopted or a register array is directly adopted.

SUMMARY

To solve the above technical problem, an objective of the present invention is to provide a data processing method and system for a 2R1W memory.

In order to realize one of the objectives of the present invention, an embodiment of the present invention provides a data processing method for a 2R1W memory.

The data processing method comprises: selecting 2n+1 SRAM2P memories with the same depth and width in accordance with a depth and a width of the 2R1W memory to construct a hardware architecture of the 2R1W memory, n being a positive integer, each SRAM2P memory having M pointer addresses, one of the plurality of SRAM2P memories being an auxiliary memory, and the rest of the SRAM2P memories being main memories; and when the data are written in and/or read from the 2R1W memory, associating data in the main memories and data in the auxiliary memory in accordance with a current pointer address of the data and performing an XOR operation on the associated data to complete data writing and reading.

As an improvement on the embodiment of the present invention, the product of the depth and the width of each SRAM2P memory=(the product of the depth and the width of the 2R1W memory)/2n.

As a further improvement on the embodiment of the present invention, said when the data are written in and/or read from the 2R1W memory, associating data in the main memories and data in the auxiliary memory in accordance with the current pointer address of the data and performing the XOR operation on the associated data to complete data writing and reading comprises:

acquiring a writing address W(x, y) of the current data, x representing an arrangement position of the SRAM2P memory where the written data are located, $0 \le x < 2n$, y representing the specific pointer address in the SRAM2P memory where the written data are located, and $0 \le y \le M$; and acquiring data in the rest main memories which have the same pointer address as the writing address, performing then XOR operation on the acquired data and the currently written data, and writing a result of the XOR operation into the same pointer address of the auxiliary memory.

As a further improvement on the embodiment of the present invention, said when the data are written in and/or read from the 2R1W memory, associating data in the main memories and data in the auxiliary memory in accordance with the current pointer address of the data and performing the XOR operation on the associated data to complete data writing and reading comprises:

if reading addresses of current two read data are in the same SRAM2P memory, respectively acquiring the reading addresses R1 (x1, y1) and R2 (x2, y2) of the two read data, x1 and y1 representing arrangement positions of the SRAM2P memory where the read data are located, $0 \le x1 < 2n$, $0 \le x2 < 2n$, y1 and y2 representing the specific pointer addresses in the SRAM2P memory where the read data are located, $0 \le y1 \le M$, and $0 \le y2 \le M$;

selecting the read data stored in any one of the reading addresses R1 (x1, y1), and directly reading the currently stored data from the currently designated reading address; and acquiring data stored in the rest main memories and the auxiliary memory which have the same pointer address as another reading address, performing the XOR operation on the acquired data, and outputting a result of the XOR operation as stored data of the another reading address.

As a further improvement on the embodiment of the present invention, said when the data are written in and/or read from the 2R1W memory, associating data in the main memories and data in the auxiliary memory in accordance with the current pointer address of the data and performing the XOR operation on the associated data to complete data writing and reading comprises:

if the reading addresses of the current two read data are located in different SRAM2P memories, directly acquiring the data of the corresponding pointer addresses in the different SRAM2P memories for independent output.

In order to realize one of the objectives of the present invention, an embodiment of the present invention provides a data processing system for a 2R1W memory. The data processing system comprises a data constructing module and a data processing module.

The data constructing module is configured to select 2n+1 SRAM2P memories with the same depth and width in accordance with a depth and a width of the 2R1W memory to construct a hardware architecture of the 2R1W memory, wherein n is a positive integer.

Each SRAM2P memory has M pointer addresses. One of the plurality of SRAM2P memories is an auxiliary memory. The rest of the SRAM2P memories are main memories.

When the data are written in and/or read from the 2R1W memory, the data processing module is configured to associate data in the main memories and data in the auxiliary memory in accordance with a current pointer address of the data and to perform an XOR operation on the associated data to complete data writing and reading.

As an improvement on the embodiment of the present invention, the product of the depth and the width of each SRAM2P memory=(the product of the depth and the width of the 2R1W memory)/2n.

As a further improvement on the embodiment of the present invention, the data processing module is configured to:

acquire a writing address W(x, y) of the current data, wherein x represents an arrangement position of the SRAM2P memory where the written data are located, $0 \leq x < 2n$, y represents the specific pointer address in the SRAM2P memory where the written data are located, and $0 \leq y \leq M$; and acquire data in the rest main memories which have the same pointer address as the writing address, perform XOR operation on the acquired data and the currently written data, and write a result of the XOR operation into the same pointer address of the auxiliary memory.

As a further improvement on the embodiment of the present invention, if reading addresses of current two read data are in the same SRAM2P memory, the data processing module is configured to:

respectively acquire the reading addresses R1 (x1, y1) and R2 (x2, y2) of the two read data, wherein x1 and y1 both represent arrangement positions of the SRAM2P memory where the read data are located, $0 \leq x1 < 2n$, $0 \leq x2 < 2n$, y1 and y2 both represent the specific pointer addresses in the SRAM2P memory where the read data are located, $0 \leq y1 \leq M$, and $0 \leq y2 \leq M$;

select the read data stored in any one of the reading addresses R1 (x1, y1), and directly read the currently stored data from the currently designated reading address; and acquire data stored in the rest main memories and the auxiliary memory which have the same pointer address as another reading address, perform the XOR operation on the acquired data, and output a result of the XOR operation as stored data of the another reading address.

As a further improvement on the embodiment of the present invention, if the reading addresses of the current two read data are located in different SRAM2P memories, the data processing module is particularly configured to: directly acquire the data of the corresponding pointer addresses in the different SRAM2P memories for independent output.

Compared with the prior art, the data processing method and system for the 2R1W memory have the advantage that only extra ½n of the memory area is required to construct the 2R1W memory based on a conventional SRAM unit. Meanwhile, only the simple XOR operation instead of a complicated control logic is needed to realize operation of multiple ports. In addition, an extra memory block mapping table or control logic is not required. Thus, the data processing method and system are lower in power consumption and higher in processing speed, save more resources or areas, are easy to implement and save manpower and material costs.

BRIEF DESCRIPTION OF THE DRAWINGS

FIG. 7*a* is a schematic view of a packet buffer logic unit of a 2R1W memory formed by an algorithm design in another embodiment of the prior art;

FIG. 7*b* is a structural schematic view of a memory block number mapping table corresponding to FIG. 7*a* in the prior art;

FIG. 8 is a schematic flow chart of a data processing method of a 2R1W memory provided by an embodiment of the present invention;

DETAILED DESCRIPTION

Figure 1:
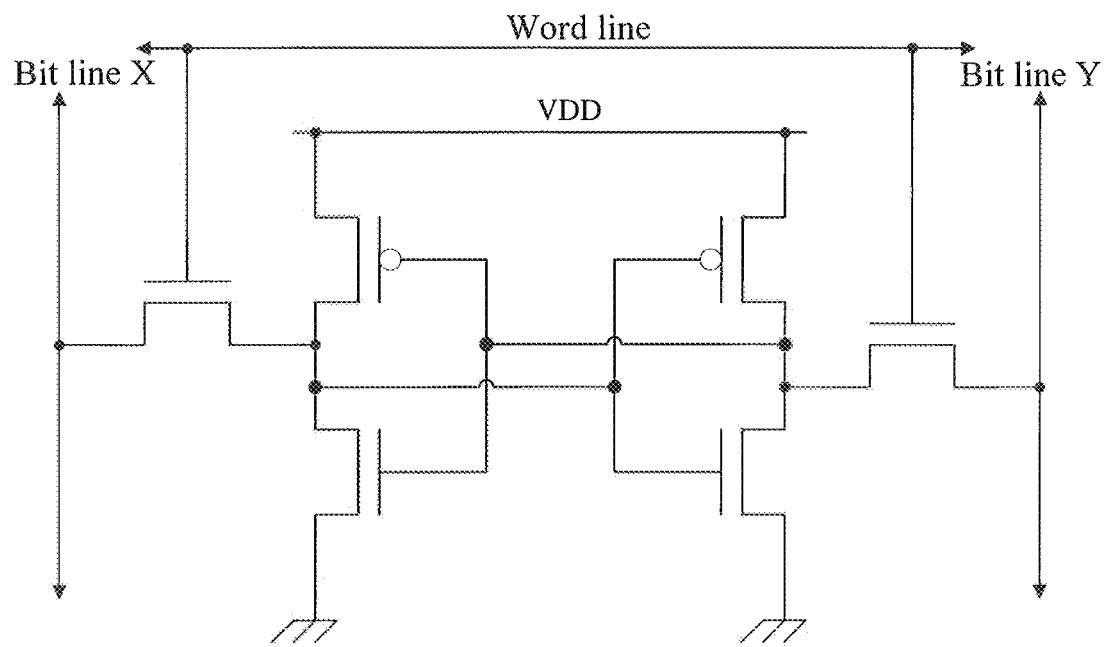
FIG. 1 is a structural schematic view of a digital circuit of a typical 6T SRAM in the prior art.
Figure 2:
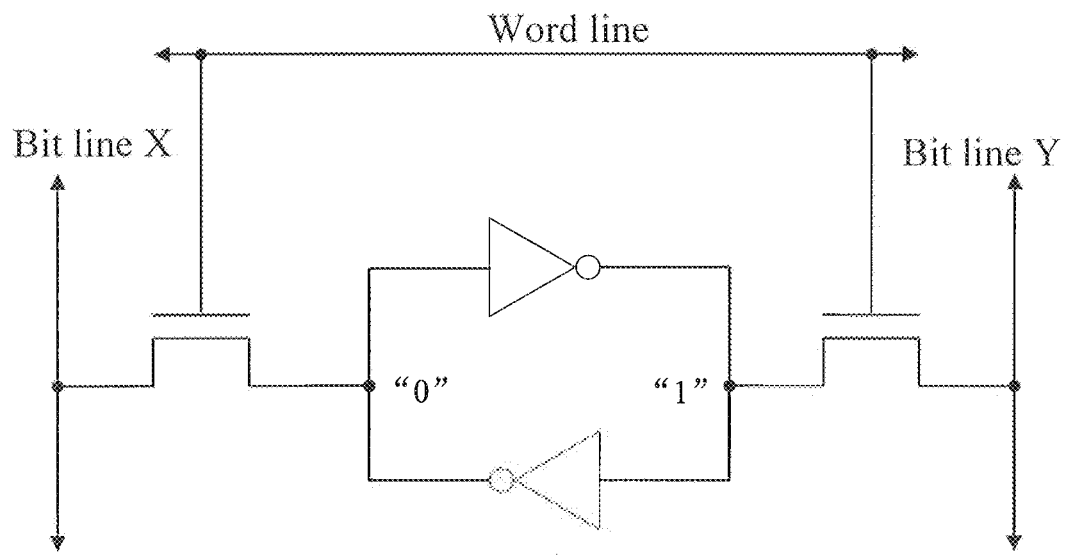
FIG. 2 is a schematic view of a simplified structure of FIG. 1 in the prior art.
Figure 3:
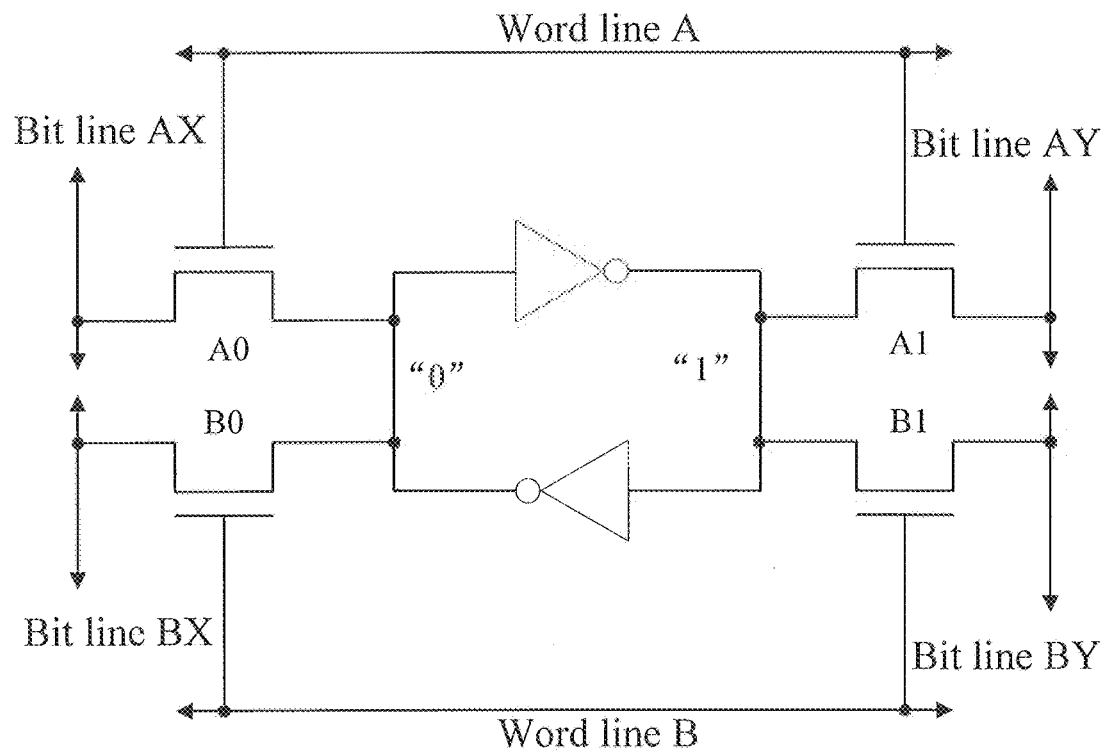
FIG. 3 is a structural schematic view of a digital circuit of a dual-port SRAM memory in the prior art.
Figure 4:
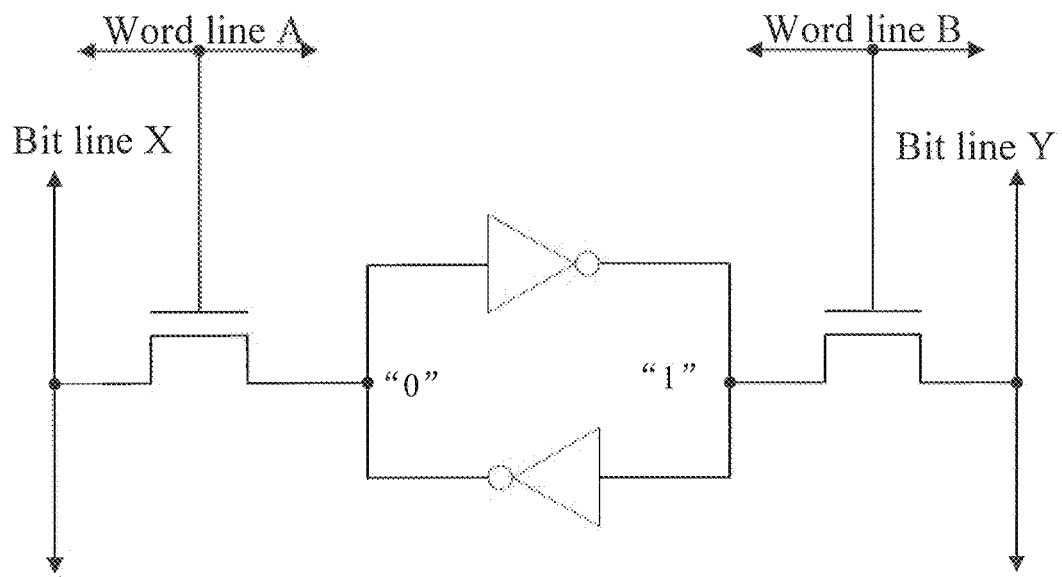
FIG. 4 is a structural schematic view of a digital circuit of a 2R1W memory formed by a customized design in an embodiment of the prior art.
Figure 5:
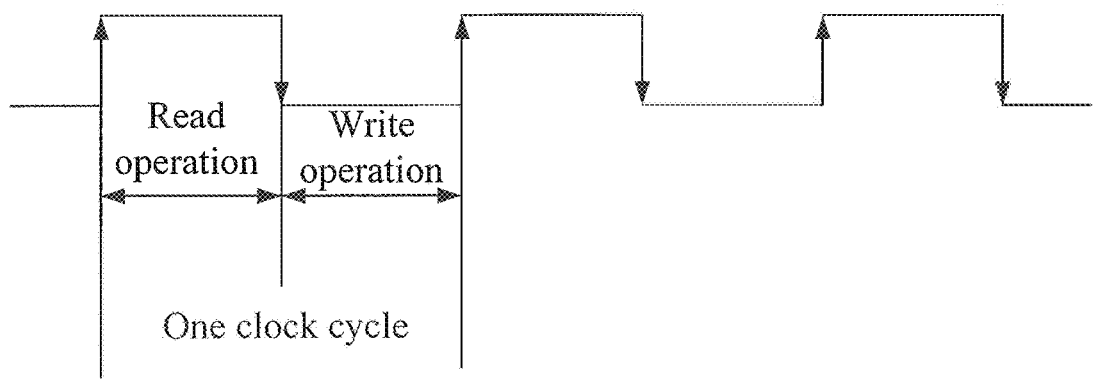
FIG. 5 is a schematic view of a read-and-write time-sharing operation procedure of a 2R1W formed by a customized design of another embodiment in the prior art.
Figure 6:
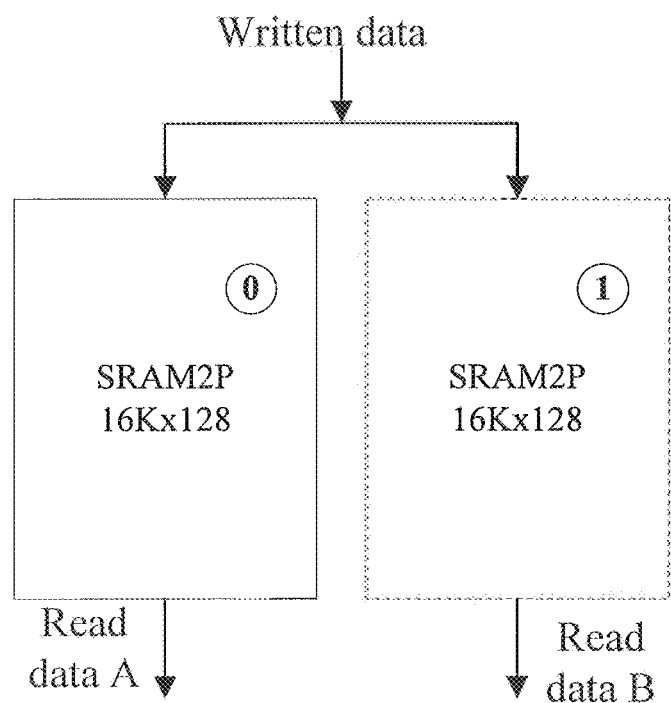
FIG. 6 is a schematic view of a packet buffer logic unit of a 2R1W memory formed by an algorithm design in an embodiment of the prior art.

The present invention will be described in detail below in conjunction with respective embodiments shown in the accompanying drawings. However, these embodiments are not intended to limit the invention, and the structures, methods, or functional changes made by those ordinary skilled in the art in accordance with the embodiments are included in the protective scope of the present invention.

As shown in FIG. 8, an embodiment of the present invention provides a data processing method for a 2R1W memory that simultaneously supports two reads and one write.

The data processing method comprises: selecting 2n+1 SRAM2P memories with the same depth and width in accordance with a depth and a width of the 2R1W memory to construct a hardware architecture of the 2R1W memory, n being a positive integer.

The plurality of SRAM2P memories are sequentially SRAM2P(0), SRAM2P(1) . . . and SRAM2P(2n) according to an arrangement sequence. Each SRAM2P memory has M pointer addresses. One of the plurality of SRAM2P memories is an auxiliary memory. The rest of the SRAM2P memories are main memories.

In a preferred embodiment of the present invention, the product of the depth and the width of each SRAM2P memory=(the product of the depth and the width of the 2R1W memory)/2n.

For the convenience of description below, the SRAM memory which has the n value of 2 and is the 16384-depth 128-width 2R1W memory is described in detail below.

In this specific example, the plurality of SRAM2P memories are sequentially SRAM2P(0), SRAM2P(1), SRAM2P(2), SRAM2P(3) and SRAM2P(4) according to the arrangement sequence. The SRAM2P(0), SRAM2P(1), SRAM2P(2) and SRAM2P(3) are the main memories. The SRAM2P(4) is the auxiliary memory. The depth and the width of each SRAM2P memory are 4096 and 128 respectively. Correspondingly, each SRAM2P memory has 4096 pointer addresses. If the pointer address of each SRAM2P memory is independently identified, the pointer address of each SRAM2P memory is 0-4095. If the addresses of all the main memories are arranged in sequence, the range of all the pointer addresses is 0-16383. In this example, SRAM2P(4) is configured to resolve a port conflict. In the embodiment, a requirement can be met without adding a memory block number mapping table.

Further, based on the above hardware architecture, the data processing method further comprises: when the data are written in and/or read from the 2R1W memory, associating data in the main memories and data in the auxiliary memory in accordance with a current pointer address of the data and performing an XOR operation on the associated data to complete data writing and reading.

In a preferred embodiment of the present invention, the data writing process comprises the following steps:

acquiring a writing address W(x, y) of the current data, x representing an arrangement position of the SRAM2P memory where the written data are located, 0≤x<2n, y representing the specific pointer address in the SRAM2P memory where the written data are located, and 0≤y≤M; and acquiring data in the rest main memories which have the same pointer address as the writing address, performing the XOR operation on the acquired data and the currently written data, and writing a result of the XOR operation into the same pointer address of the auxiliary memory.

Figure 9:
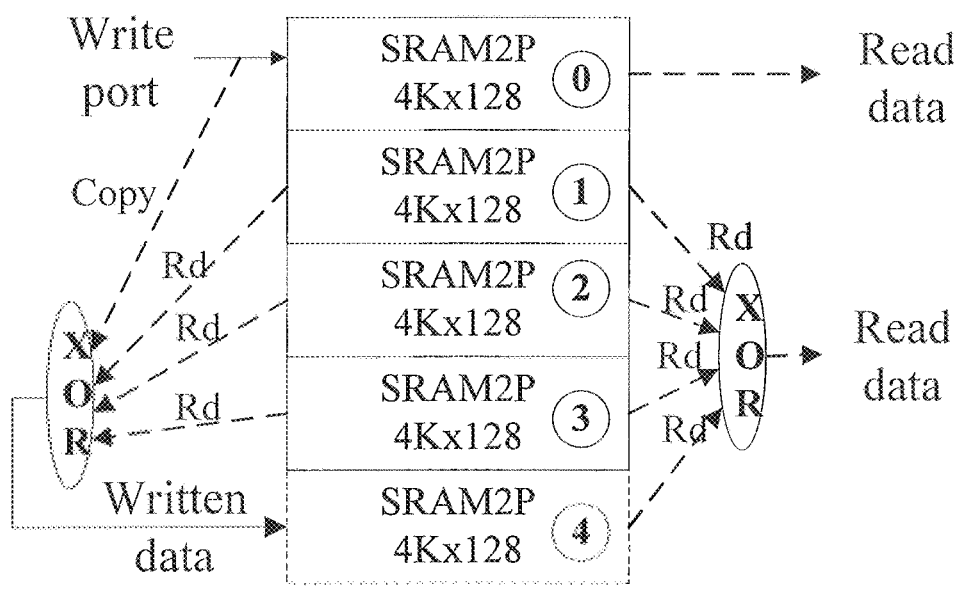
FIG. 9 is a schematic view of a packet buffer logic unit of a 2R1W memory provided by an embodiment of the present invention.

With reference to FIG. 9, in a specific example of the present invention, a datum 128-bit all "1" is written to the pointer address "5" in SRAM2P(0). That is, the writing address of the current datum is W(0, 5). In the data writing process, in addition to directly writing the datum 128-bit all "1" to the pointer address "5" in SRAM2P(0) of a specified location, meanwhile, data of the rest main memories at the same pointer address need to be read. Assuming that a datum read from the pointer address "5" in SRAM2P(1) is 128-bit all "1", a datum read from the pointer address "5" in SRAM2P(2) is 128-bit all "0", and a datum read from the pointer address "5" in SRAM2P(3) is 128-bit all "1", then an XOR operation is performed on the data 128-bit all "1", 128-bit all "0", 128-bit all "1" and 128-bit all "1". The result "1" of the XOR operation is simultaneously written to the pointer address "5" in SRAM2P(4). In this way, two read ports and one write port of the 2R1W memory are operated simultaneously.

Further, in a preferred embodiment of the present invention, the data reading process comprises the following steps:

if reading addresses of current two read data are in the same SRAM2P memory, respectively acquiring the reading addresses R1 (x1, y1) and R2 (x2, y2) of the two read data, x1 and y1 representing arrangement positions of the SRAM2P memory where the read data are located, 0≤x1<2n, 0≤x2<2n, y1 and y2 representing the specific pointer addresses in the SRAM2P memory where the read data are located, 0≤y1≤M, and 0≤y2≤M;

selecting the read data stored in any one of the reading addresses R1 (x1, y1), and directly reading the currently stored data from the currently designated reading address; and acquiring data stored in the rest main memories and the auxiliary memory which have the same pointer address as another reading address, performing the XOR operation on the acquired data, and outputting a result of the XOR operation as stored data of the another reading address.

Then as shown in FIG. 9, in a specific example of the present invention, there are two read data. Their pointer addresses are the pointer address "2" in SRAM2P(0) and the pointer address "5" in SRAM2P(0) respectively. That is, the reading addresses of the current data are R (0, 2) and R (0, 5).

In the process of reading the data from the 2R1W memory, since each SRAM2P can only guarantee that one read port and one write port are operated simultaneously, the read port directly reads data from the pointer address "2" in SRAM2P(0), but the request of the other read port cannot be met. Correspondingly, the problem that the data are simultaneously read from the two read ports is solved by means of the XOR operation.

For data in R(0,5), the data of the pointer addresses "5" of the rest three main memories and the auxiliary memory are read respectively and subjected to the XOR operation. By following the above example, a datum read from the pointer address "5" in the SRAM2P(1) is "1", a datum read from the pointer address "5" in the SRAM2P(2) is "0", a datum read from the pointer address "5" in the SRAM2P(3) is 128-bit all "1", and a datum read from the pointer address "5" in the SRAM2P(4) is 128-bit all "1". The XOR operation is performed on the data 128-bit all "1", 128-bit all "1", 128-bit all "0" and 128-bit all "1" to obtain 128-bit "1". The result 128-bit all "1" of the XOR operation is used as the stored data of the pointer address "5" in the SRAM2P(0) for output. The result of the data obtained by the above process is completely consistent with the data stored in the pointer address "5" in the SRAM2P(0). Thus, according to the current pointer position of the data, the data in the main memories and the data in the auxiliary memory are associated. The XOR operation is performed on the associated data to complete data writing and reading.

In an embodiment of the present invention, if the reading addresses of the current two read data are located in different SRAM2P memories, the data of the corresponding pointer addresses in the different SRAM2P memories are directly acquired for independent output.

As shown in FIG. 9, in a specific example of the present invention, there are two read data. Their pointer addresses are the pointer address "5" in the SRAM2P(0) and the pointer address "10" in the SRAM2P(1) respectively. That is, the current data reading addresses are R (0, 5) and R (1, 10).

In the process of reading data from the 2R1W memory, each SRAM2P can ensure that one read port and one write port are operated simultaneously. Therefore, in the data reading process, the data are directly read from the pointer address "5" in the SRAM2P(0). The data are directly read from the pointer address "10" in the SRAM2P(1). Thus, the two read ports and one write port of the 2R1W memory are simultaneously operated, which will not be repeated in detail herein.

As described above, only extra ½n of the memory area is required to construct the 2R1W memory based on a conventional SRAM unit.

It should be noted that if each SRAM2P is further divided logically, for example, if it is divided into 4n SRAM2Ps having the same depth, the above 2R1W SRAM can be constructed by only adding the extra ¼n of the memory area. Correspondingly, the number of SRAM blocks is also increased by nearly 2 times physically. A lot of area overhead will be occupied in actual locating and wiring. Of course, the present invention is not limited to the above specific embodiments, and other solutions using the XOR operation to expand the memory ports are also included in the scope of protection of the present invention, which will not be repeated in detail herein.

Figure 10:
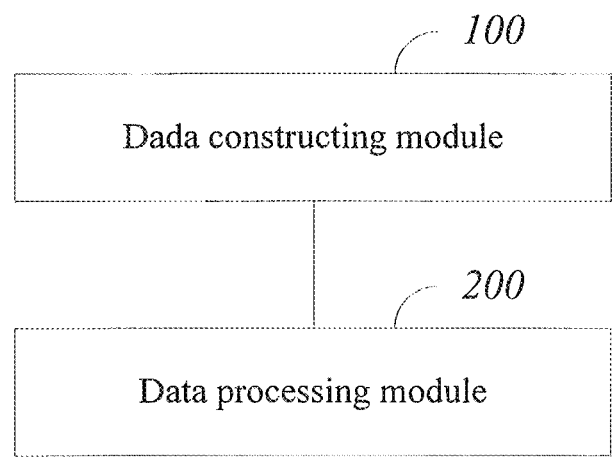
FIG. 10 is a module schematic view of a data processing system of a 2R1W memory provided by an embodiment of the present invention.

With reference to FIG. 10, an embodiment of the present invention provides a data processing system of a 2R1W memory. The data processing system comprises a data constructing module 100 and a data processing module 200.

The 2R1W memory is a memory that supports two reads and one write simultaneously. The data constructing module 100 comprises a plurality of SRAM2P memories.

The data constructing module 100 is configured to select 2n+1 SRAM2P memories with the same depth and width in accordance with a depth and a width of the 2R1W memory to construct a hardware architecture of the 2R1W memory, wherein n is a positive integer.

The plurality of SRAM2P memories are sequentially SRAM(0), SRAM2P(1) . . . and SRAM2P(2n). Each SRAM2P memory has M pointer addresses. One of the plurality of SRAM2P is an auxiliary memory. The rest of the SRAM2P memories are main memories.

In a preferred embodiment of the present invention, the product of the depth and the width of each SRAM2P memory=(the product of the depth and the width of the 2R1W memory)/2n.

For the convenience of description below, the SRAM memory which has the n value of 2 and is the 16384-depth 128-width 2R1W memory is described in detail below.

In this specific example, the plurality of SRAM2P memories are sequentially SRAM2P(0), SRAM2P(1), SRAM2P(2), SRAM2P(3) and SRAM2P(4) according to the arrangement sequence. The SRAM2P(0), SRAM2P(1), SRAM2P(2) and SRAM2P(3) are the main memories. The SRAM2P(4) is the auxiliary memory. The depth and the width of each SRAM2P memory are 4096 and 128 respectively. Correspondingly, each SRAM2P memory has 4096 pointer addresses. If the pointer address of each SRAM2P memory is independently identified, the pointer address of each SRAM2P memory is 0-4095. If the addresses of all the main memories are arranged in sequence, the range of all the pointer addresses is 0-16383. In this example, SRAM2P(4) is configured to resolve a port conflict. In the embodiment, a requirement can be met without adding a memory block number mapping table.

Further, based on the hardware architecture, when the data are written in and/or read from the 2R1W memory, the data processing module is configured to associate data in the main memories and data in the auxiliary memory in accordance with a current pointer address of the data and to perform an XOR operation on the associated data to complete data writing and reading.

In a preferred embodiment of the present invention, the data writing process of the data processing module 200 is as below.

The data processing module 200 is configured to acquire a writing address W(x, y) of the current data, wherein x represents an arrangement position of the SRAM2P memory where the written data are located, 0≤x<2n, y represents the specific pointer address in the SRAM2P memory where the written data are located, and 0≤y≤M.

The data processing module 200 is configured to acquire data in the rest main memories which have the same pointer address as the writing address, perform the XOR operation on the acquired data and the currently written data, and write a result of the XOR operation into the same pointer address of the auxiliary memory.

With referent to FIG. 9, in a specific embodiment of the present invention, the data processing module 200 is configured to write a datum 128-bit all "1" to the pointer address "5" in SRAM2P(0). That is, the writing address of the current datum is W(0, 5). In the data writing process, in addition to directly writing the datum 128-bit all "1" to the pointer address "5" in SRAM2P(0) of a specified location, meanwhile, data of the rest main memories at the same pointer address need to be read. Assuming that a datum read from the pointer address "5" in SRAM2P(1) is 128-bit all "1", a datum read from the pointer address "5" in SRAM2P (2) is 128-bit all "0", and a datum read from the pointer address "5" in SRAM2P(3) is 128-bit all "1", an XOR operation is performed on the data 128-bit all "1", 128-bit all "0", 128-bit all "1" and 128-bit all "1", and the result "1" of the XOR operation is simultaneously written to the pointer address "5" in SRAM2P(4). In this way, two read ports and one write port of the 2R1W memory are operated simultaneously.

Further, in the preferred embodiment of the present invention, the data reading process of the data processing module 200 is as below.

If reading addresses of current two read data are in the same SRAM2P memory, the data processing module 200 is configured to respectively acquire the reading addresses R1 (x1, y1) and R2 (x2, y2) of the two read data, wherein x1 and y1 both represent arrangement positions of the SRAM2P memory where the read data are located, 0≤x1<2n, 0≤x2<2n, y1 and y2 both represent the specific pointer addresses in the SRAM2P memory where the read data are located, 0≤y1≤M, and 0≤y2≤M.

The data processing module 200 is configured to select the read data stored in any one of the reading addresses R1 (x1, y1), and to directly read the currently stored data from the currently designated reading address.

The data processing module 200 is configured to acquire data stored in the rest main memories and the auxiliary memory which have the same pointer address as another reading address, to perform the XOR operation on the acquired data, and to output a result of the XOR operation as stored data of the another reading address.

Then as shown in FIG. 9, in a specific example of the present invention, there are two read data. Their pointer addresses are the pointer address "2" in SRAM2P(0) and the pointer address "5" in SRAM2P(0) respectively. That is, the reading addresses of the current data are R (0, 2) and R (0, 5).

When the data processing module 200 reads the data from the 2R1W memory, since each SRAM2P can only guarantee that one read port and one write port are operated simultaneously, the read port directly reads data from the pointer address "2" in SRAM2P(0), but the request of the other read port cannot be met. Correspondingly, the problem that the data are simultaneously read from the two read ports is solved by means of the XOR operation.

For data in R(0,5), the data processing module 200 respectively read the data of the pointer addresses "5" of other three main memories and the auxiliary memory and performs the XOR operation on the read data. By following the above example, a datum read from the pointer address "5" in the SRAM2P(1) is "1", a datum read from the pointer address "5" in the SRAM2P(2) is "0", a datum read from the pointer address "5" in the SRAM2P(3) is 128-bit all "1", and a datum read from the pointer address "5" in the SRAM2P (4) is 128-bit all "1". The XOR operation is performed on the data 128-bit all "1", 128-bit all "1", 128-bit all "0" and 128-bit all "1" to obtain 128-bit "1". The result 128-bit all "1" of the XOR operation is used as the stored data of the pointer address "5" in the SRAM2P(0) for output. The result of the data obtained by the above process is completely consistent with the data stored in the pointer address "5" in the SRAM2P(0). Thus, according to the current pointer position of the data, the data in the main memories and the data in the auxiliary memory are associated by the data processing module 200. The XOR operation is performed on the associated data by the data processing module 200 to complete data writing and reading.

In an embodiment of the present invention, if the reading addresses of the current two read data are located in different SRAM2P memories, the data of the corresponding pointer addresses in the different SRAM2P memories are directly acquired by the data processing module 200 for independent output.

As shown in FIG. 9, in a specific example of the present invention, there are two read data. Their pointer addresses are the pointer address "5" in the SRAM2P(0) and the pointer address "10" in the SRAM2P(1) respectively. That is, the current data reading addresses are R (0, 5) and R (1, 10).

When the data processing module 200 reads the data from the 2R1W memory, each SRAM2P can ensure that one read port and one write port are operated simultaneously. Therefore, in the data reading process, the data are directly read from the pointer address "5" in the SRAM2P(0). The data are directly read from the pointer address "10" in the SRAM2P(1). Thus, the two read ports and one write port of the 2R1W memory are simultaneously operated, which will not be repeated in detail herein.

As described above, only extra ½n of the memory area is required to construct the 2R1W memory based on a conventional SRAM unit.

It should be noted that if each SRAM2P is further divided logically, for example, if it is divided into 4n SRAM2Ps having the same depth, the above 2R1 W SRAM can be constructed by only adding the extra ¼n of the memory area. Correspondingly, the number of SRAM blocks is also increased by nearly 2 times physically. A lot of area overhead will be occupied in actual locating and wiring. Of course, the present invention is not limited to the above specific embodiments, and other solutions using the XOR operation to expand the memory ports are also included in the scope of protection of the present invention, which will not be repeated in detail herein.

To sum up, according to the data processing method and system for the 2R1W memory, provided by the present invention, only extra ½n of the memory area is required to construct the 2R1W memory based on a conventional SRAM unit. Meanwhile, only a simple XOR operation instead of a complicated control logic is needed to realize operation of multiple ports. In addition, an extra memory block mapping table or control logic is not required. Thus, the data processing method and system are lower in power consumption and higher in processing speed, save more resources or areas, are easy to implement and save manpower and material costs.

For the convenience of description, the above apparatuses are described with separate modules based on the functions of these modules. Of course, the functions of these modules may be realized in the same or multiple pieces of software and/or hardware when carrying out the present invention.

The apparatus embodiments described above are only illustrative. The modules described as separate members may or may not be physically separated. The members displayed as modules may or may not be physical modules, may be located at the same location and may be distributed in multiple network modules. The objectives of the solutions of these embodiments may be realized by selecting a part or all of these modules according to the actual needs, and may be understood and implemented by those skilled in the art without any inventive effort.

It should be understood that although the description is described according to the embodiments, not every embodiment only includes one independent technical solution, that such a description manner is only for the sake of clarity, that those skilled in the art should take the description as an integral part, and that the technical solutions in the embodiments may be suitably combined to form other embodiments understandable by those skilled in the art.

The above detailed description only specifies feasible embodiments of the present invention, and is not intended to limit the protection scope thereof. All equivalent embodiments or modifications not departing from the spirit of the present invention should be included in the protection scope of the present invention.

What is claimed is:

1. A data processing method for a 2R1W memory, comprising:
    selecting 2n+1 SRAM2P memories with the same depth and width in accordance with a depth and a width of the 2R1W memory to construct a hardware architecture of the 2R1W memory, n being a positive integer,
    each SRAM2P memory having M pointer addresses, one of the plurality of SRAM2P memories being an auxiliary memory, and the rest of the SRAM2P memories being main memories; and
    when the data are written in and/or read from the 2R1W memory, associating data in the main memories and data in the auxiliary memory in accordance with a current pointer address of the data and performing an exclusive or (XOR) operation on the associated data to complete data writing and reading.

2. The data processing method for the 2R1W memory according to claim 1, wherein the product of the depth and the width of each SRAM2P memory=(the product of the depth and the width of the 2R1W memory)/2n.

3. The data processing method for the 2R1W memory according to claim 1, wherein said when the data are written in and/or read from the 2R1W memory, associating data in the main memories and data in the auxiliary memory in accordance with the current pointer address of the data and performing the XOR operation on the associated data to complete data writing and reading comprises:
   acquiring a writing address W(x, y) of the current data, x representing an arrangement position of the SRAM2P memory where the written data are located, $0 \leq x < 2n$, y representing the specific pointer address in the SRAM2P memory where the written data are located, and $0 \leq y \leq M$; and
   acquiring data in the rest main memories which have the same pointer address as the writing address, performing the XOR operation on the acquired data and the currently written data, and writing a result of the XOR operation into the same pointer address of the auxiliary memory.

4. The data processing method for the 2R1W memory according to claim 1, wherein said when the data are written in and/or read from the 2R1W memory, associating data in the main memories and data in the auxiliary memory in accordance with the current pointer address of the data and performing the XOR operation on the associated data to complete data writing and reading comprises:
   if reading addresses of current two read data are in the same SRAM2P memory,
   respectively acquiring the reading addresses R1 (x1, y1) and R2 (x2, y2) of the two read data, x1 and y1 representing arrangement positions of the SRAM2P memory where the read data are located, $0 \leq x1 < 2n$, $0 \leq x2 < 2n$, y1 and y2 representing the specific pointer addresses in the SRAM2P memory where the read data are located, $0 \leq y \leq M$, and $0 \leq y2 \leq M$;
   selecting the read data stored in any one of the reading addresses R1 (x1, y1), and directly reading the currently stored data from the currently designated reading address; and
   acquiring data stored in the rest main memories and the auxiliary memory which have the same pointer address as another reading address, performing the XOR operation on the acquired data, and outputting a result of the XOR operation as stored data of the another reading address.

5. The data processing method for the 2R1W memory according to claim 1, wherein said when the data are written in and/or read from the 2R1W memory, associating data in the main memories and data in the auxiliary memory in accordance with the current pointer address of the data and performing the XOR operation on the associated data to complete data writing and reading comprises:
   if the reading addresses of the current two read data are located in different SRAM2P memories,
   directly acquiring the data of the corresponding pointer addresses in the different SRAM2P memories for independent output.

6. The data processing method for the 2R1W memory according to claim 2, wherein said when the data are written in and/or read from the 2R1W memory, associating data in the main memories and data in the auxiliary memory in accordance with the current pointer address of the data and performing the XOR operation on the associated data to complete data writing and reading comprises:
   acquiring a writing address W(x, y) of the current data, x representing an arrangement position of the SRAM2P memory where the written data are located, $0 \leq x < 2n$, y representing the specific pointer address in the SRAM2P memory where the written data are located, and $0 \leq y \leq M$; and
   acquiring data in the rest main memories which have the same pointer address as the writing address, performing the XOR operation on the acquired data and the currently written data, and writing a result of the XOR operation into the same pointer address of the auxiliary memory.

7. The data processing method for the 2R1W memory according to claim 2, wherein said when the data are written in and/or read from the 2R1W memory, associating data in the main memories and data in the auxiliary memory in accordance with the current pointer address of the data and performing the XOR operation on the associated data to complete data writing and reading comprises:
   if reading addresses of current two read data are in the same SRAM2P memory,
   respectively acquiring the reading addresses R1 (x1, y1) and R2 (x2, y2) of the two read data, x1 and y1 representing arrangement positions of the SRAM2P memory where the read data are located, $0 \leq x1 < 2n$, $0 \leq x2 < 2n$, y1 and y2 representing the specific pointer addresses in the SRAM2P memory where the read data are located, $0 \leq y1 \leq M$, and $0 \leq y2 \leq M$;
   selecting the read data stored in any one of the reading addresses R1 (x1, y1), and directly reading the currently stored data from the currently designated reading address; and
   acquiring data stored in the rest main memories and the auxiliary memory which have the same pointer address as another reading address, performing the XOR operation on the acquired data, and outputting a result of the XOR operation as stored data of the another reading address.

8. The data processing method for the 2R1W memory according to claim 2, wherein said when the data are written in and/or read from the 2R1W memory, associating data in the main memories and data in the auxiliary memory in accordance with the current pointer address of the data and performing the XOR operation on the associated data to complete data writing and reading comprises:
   if the reading addresses of the current two read data are located in different SRAM2P memories,
   directly acquiring the data of the corresponding pointer addresses in the different SRAM2P memories for independent output.

9. A data processing system for a 2R1W memory, comprising a data constructing module and a data processing module, wherein
   the data constructing module is configured to select 2n+1 SRAM2P memories with the same depth and width in accordance with a depth and a width of the 2R1W memory to construct a hardware architecture of the 2R1W memory, wherein n is a positive integer;
   each SRAM2P memory has M pointer addresses, one of the plurality of SRAM2P memories is an auxiliary memory, and the rest of the SRAM2P memories are main memories; and
   when the data are written in and/or read from the 2R1W memory, the data processing module is configured to associate data in the main memories and data in the auxiliary memory in accordance with a current pointer address of the data and performing an XOR operation on the associated data to complete data writing and reading.

10. The data processing system for the 2R1W memory according to claim 9, wherein if reading addresses of current two read data are in the same SRAM2P memory, the data processing module is configured to:

respectively acquire the reading addresses R1 (x1, y1) and R2 (x2, y2) of the two read data, wherein x1 and y1 represent arrangement positions of the SRAM2P memory where the read data are located, $0 \leq x1 < 2n$, $0 \leq x2 < 2n$, y1 and y2 represent the specific pointer addresses in the SRAM2P memory where the read data are located, $0 \leq y1 \leq M$, and $0 \leq y2 \leq M$;

select the read data stored in any one of the reading addresses R1 (x1, y1), and directly read the currently stored data from the currently designated reading address; and acquire data stored in the rest main memories and the auxiliary memory which have the same pointer address as another reading address, perform the XOR operation on the acquired data, and output a result of the XOR operation as stored data of the another reading address.

11. The data processing system for the 2R1W memory according to claim 10, wherein the product of the depth and the width of each SRAM2P memory=(the product of the depth and the width of the 2R1W memory)/2n.

12. The data processing system for the 2R1W memory according to claim 10, wherein the data processing module is configured to:

acquire a writing address W(x, y) of the current data, wherein x represents an arrangement position of the SRAM2P memory where the written data are located, $0 \leq x < 2n$, y represents the specific pointer address in the SRAM2P memory where the written data are located, and $0 \leq y \leq M$; and acquire data in the rest main memories which have the same pointer address as the writing address, perform XOR operation on the acquired data and the currently written data, and write a result of the XOR operation into the same pointer address of the auxiliary memory.

13. The data processing system for the 2R1W memory according to claim 10, wherein if the reading addresses of the current two read data are located in different SRAM2P memories, the data processing module is configured to: directly acquire the data of the corresponding pointer addresses in the different SRAM2P memories for independent output.

14. The data processing system for the 2R1W memory according to claim 13, wherein the data processing module is configured to:

acquire a writing address W(x, y) of the current data, wherein x represents an arrangement position of the SRAM2P memory where the written data are located, $0 \leq x < 2n$, y represents the specific pointer address in the SRAM2P memory where the written data are located, and $0 \leq y \leq M$; and acquire data in the rest main memories which have the same pointer address as the writing address, perform XOR operation on the acquired data and the currently written data, and write a result of the XOR operation into the same pointer address of the auxiliary memory.

15. The data processing system for the 2R1W memory according to claim 13, wherein if reading addresses of current two read data are in the same SRAM2P memory, the data processing module is configured to:

respectively acquire the reading addresses R1 (x1, y1) and R2 (x2, y2) of the two read data, wherein x1 and y1 represent arrangement positions of the SRAM2P memory where the read data are located, $0 \leq x1 < 2n$, $0 \leq x2 < 2n$, y1 and y2 represent the specific pointer addresses in the SRAM2P memory where the read data are located, $0 < y1 < M$, and $0 \leq y2 \leq M$;

select the read data stored in any one of the reading addresses R1 (x1, y1), and directly read the currently stored data from the currently designated reading address; and acquire data stored in the rest main memories and the auxiliary memory which have the same pointer address as another reading address, perform the XOR operation on the acquired data, and output a result of the XOR operation as stored data of the another reading address.

16. The data processing system for the 2R1W memory according to claim 13, wherein if the reading addresses of the current two read data are located in different SRAM2P memories, the data processing module is configured to: directly acquire the data of the corresponding pointer addresses in the different SRAM2P memories for independent output.

* * * * *